(12) United States Patent
Usui et al.

(10) Patent No.: US 6,642,622 B2
(45) Date of Patent: Nov. 4, 2003

(54) SEMICONDUCTOR DEVICE WITH PROTECTIVE LAYER

(75) Inventors: Takamasa Usui, Fujisawa (JP); Sachiyo Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/369,517

(22) Filed: Feb. 21, 2003

(65) Prior Publication Data

US 2003/0160327 A1 Aug. 28, 2003

(30) Foreign Application Priority Data

Feb. 28, 2002 (JP) .......................... 2002-053212

(51) Int. Cl.⁷ .............................. H01L 23/48
(52) U.S. Cl. ........................ 257/758; 257/659
(58) Field of Search ................. 257/660, 659, 257/758, 765

(56) References Cited

FOREIGN PATENT DOCUMENTS

| JP | 10-199882 | 7/1998 |
|----|-----------|--------|
| JP | 10-335327 | 12/1998 |

*Primary Examiner*—Roy Potter
(74) *Attorney, Agent, or Firm*—Finnegan, Henderson, Farabow, Garrett & Dunner, L.L.P.

(57) ABSTRACT

A semiconductor device includes a substrate and a first insulating film provided above the semiconductor substrate. A first interconnecting layer is provided on the first insulating film. A second insulating film is provided above the first interconnecting layer and the first insulating layer. A first protective film is provided above the second insulating film and composed substantially of metal material. A second protective film is composed substantially of a passivity of the metal material and provided on a surface of the first protective film.

20 Claims, 13 Drawing Sheets

SEMICONDUCTOR DEVICE WITH PROTECTIVE LAYER

CROSS-REFERENCE TO RELATED APPLICATIONS

This application is based upon and claims the benefit of priority from the prior Japanese Patent Application No. 2002-053212, filed Feb. 28, 2002, the entire contents of which are incorporated herein by reference.

BACKGROUND OF THE INVENTION

1. Field of the Invention

The present invention relates to a semiconductor device, and in particular, to a multilayer interconnected structure used to effectively release heat generated by interconnecting layers out of semiconductor device.

2. Description of the Related Art

In recent years, a multilayer interconnected structure has been employed to deal with finer semiconductor devices and their high-level integration.

A factor that determines an upper limit on current density or current that can be applied to interconnecting layers in an LSI (Large Scale Integrated Circuit) is an increase in temperature caused by electromigration (EM) in the interconnecting layers and Joule heat from them. The amount of heat generated by all interconnecting layers in the LSI is calculated by adding amounts of joule heat from these interconnecting layers together. Heat in any interconnecting layer results in a difference in temperature between the device and its exterior. Thus, heat is released to the exterior of the LSI in proportion to the difference in temperature×heat conductivity×the area of the interconnecting layer. Where the amount of heat generated and the amount of heat released (proportional to the difference in temperature) are in balance, a thermally balanced state is established. The difference in temperature measured at that time corresponds to an increase in the temperature of the LSI.

Insulating material generally has a low heat conductivity. Various insulating materials used for an LSI generally have a heat conductivity of about 0.10 W/mK to 5.00 W/mK. On the other hand, metal material has a heat conductivity of 30 W/mk to 400 W/mk, which is much higher than the insulating material. Thus, large differences in heat conductivity among materials result in difficulty to release heat out of the LSI device. Material having a high heat conductivity must be used for portions of the device from which heat must be released out of the device, so as to efficiently release heat from the interconnecting layers out of the device.

To efficiently release heat from each interconnecting layer to the exterior, it is contemplated that material used may be selected so that heat can be transmitted toward a front surface, where a passivation film is located (upward), or toward a semiconductor substrate (downward). To facilitate heat release toward the semiconductor substrate, it is contemplated that material having a high heat conductivity may be used for metal plugs connecting the interconnecting layers and the substrate together and that the percentage of the entire cross section taken up by the cross section of the metal plugs may be increased as much as possible. However, a large number of elements such as transistors and capacitors are formed on the substrate, with the number of elements increasing consistently with the density of the LSI. Accordingly, this approach hinders an increase in the density of the LSI.

On the other hand, in the multilayer interconnected structure of a conventional LSI, a silicon oxide film, a silicon nitride film, or a film formed by stacking these films together is generally used as a passivation film used to prevent moisture, contaminants, and the like from entering the interior of the device. The silicon oxide film and the silicon nitride film have very low heat conductivities. Further, the conventional passivation film covers the entire front surface of the LSI device except for its part on a pad electrode layer. Consequently, conventional LSI products release only a small amount of heat to the exterior. Improving the heat release characteristic of the passivation film is very effective in suppressing an increase in the temperature of the interconnects in the LSI.

Copper is preferable as a material for an interconnecting layer because it has more tolerance to electromigration and less resistance than aluminum. However, if copper or the like is used as a material for interconnecting layers, larger current can be applied. This increases the amount of Joule heat generated by each interconnecting layer. In this case, the allowable amount of current applied is limited by the external heat release characteristic.

Further, when copper or the like is used as interconnecting layer material, it is necessary to use an insulating film of a small dielectric constant to reduce parasitic capacity to maintain the appropriate value of the interconnect resistance. The insulating film of a small dielectric constant is constructed to be porous and thus has a low heat conductivity. Thus, heat generated by surrounding interconnecting layers is not released to the exterior. Further, a more serious problem occurs if a so-called aerial interconnected structure is used to drastically reduce the parasitic capacity.

In particular, if copper is used for interconnecting layers in an LSI having multilayer interconnecting layers, the amount of heat generated by all interconnecting layers increases consistently with the total number of interconnecting layers increasing. Accordingly, the temperature of the LSI is likely to increase rapidly. Therefore, measures are required for preventing the performance of LSI products from being degraded and maintaining reliability for a long time.

BRIEF SUMMARY OF THE INVENTION

According to a first aspect of the present invention, there is provided a semiconductor device comprising a semiconductor substrate, a first insulating film provided above the semiconductor substrate, a first interconnecting layer provided on the first insulating film, a second insulating film provided above the first interconnecting layer and the first insulating layer, a first protective film provided above the second insulating film, composed substantially of metal material, and a second protective film composed substantially of a passivity of the metal material, provided on a surface of the first protective film.

DETAILED DESCRIPTION OF THE INVENTION

Figure 1:
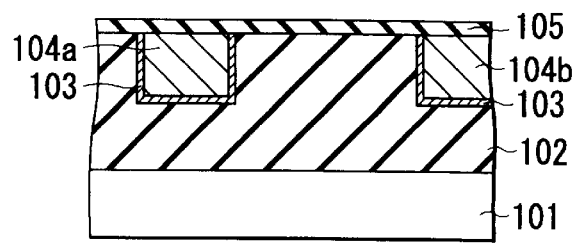
FIGS. 1, 2, 3, 4, 5, 6, 7, 8, 9, and 10 are sectional views showing a process of manufacturing a semiconductor device according to a first embodiment of the present invention.

Embodiments of the present invention will be described below with reference to the drawings. In the description below, components having substantially the same functions and configurations are denoted by the same reference numerals. Duplicate description is given only when required.

First Embodiment

In a first embodiment, a passivation film comprises a metal film having a high heat conductivity instead of an insulating film conventionally using such as a silicon oxide film or a silicon nitride film. An example of this metal film is material such as aluminum or its alloy which is thin and dense and forms a thin insulating film (a so-called passive film) in its surface layer portion. If a thin insulating film is formed in the metal film, the passivation film acts effectively as a protecting and heat releasing members. That is, this film prevents entry of moisture or the like into a semiconductor device and corrosion or the like of the metal film and improves the heat release characteristic of the semiconductor device because it is mainly composed of metal such as aluminum.

Description of a process of manufacturing a semiconductor device according to the present embodiment will be given below. In the present embodiment, by way of example, copper is used as material for interconnecting layers. Further, a three-layer interconnected structure is formed by applying a damascene interconnected structure or a dual damascene interconnected structure to each layer.

As shown in FIG. 1, an insulating film 102 constituting a first layer is formed on a semiconductor substrate 101 composed of, for example, silicon. The insulating film 102 as the first layer is a silicon oxide film (SiO$_2$) formed, for example, by a plasma CVD process. Further, the insulating film 102 has a relative dielectric constant of about 1.1 to 4.2. A porous silicon oxide film and SiOC and the like can be used as the insulating film 102. Elements such as transistors and capacitors are formed on the semiconductor substrate 101 at predetermined positions (not shown).

Next, a lithography technique is used to form a mask pattern of photo resist. Then, this mask pattern is used to form interconnecting trenches in the insulating film 102 at predetermined positions at predetermined intervals by a dry etching technique. For example, an RIE process is used as the dry etching technique. A material film (for example, tantalum nitride (TaN)) with a predetermined film thickness for a barrier metal layer is deposited on walls of the interconnecting trenches. A material film (for example, copper (Cu)) for interconnecting layers is formed on the barrier metal material film, burying inside the trenches. Subsequently, an extra material film on the insulating film is removed by a CMP process or the like, and the front surface is flattened. As a result, a barrier metal layer 103 and interconnecting layers 104a and 104b are formed. The barrier metal layer 103 prevents the copper components of the interconnecting layers from diffusing to the insulating film 102. Further, in addition to the tantalum nitride film, a film made of tantalum or the like may be used as the barrier metal layer 103.

Next, a barrier layer 105 composed of, for example, silicon nitride (SiNx) film is formed to a thickness of 30 nm to 70 nm by the plasma CVD process. In addition to the silicon nitride film, an insulating film composed of silicon carbide (SiCx) may be used as the barrier layer 105. Also in this case, the plasma CVD process may be used to form a film to a thickness of about 30 to 70 nm.

Figure 2:
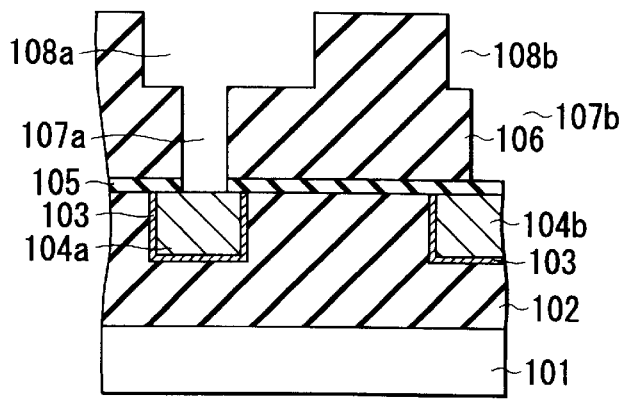

Next, as shown in FIG. 2, an insulating film 106 constituting a second layer is formed on the barrier layer 105. Then, the lithography technique and the dry etching technique are used to form via holes 107a and 107b and interconnecting trenches 108a and 108b in the insulating film 106. The via holes 107a and 107b are formed to connect to the interconnecting layers 104a and 104b, respectively. The trenches 108a and 108b are formed to connect to the via holes 107a and 107b, respectively. For example, the RIE process is used as the dry etching technique.

Figure 3:
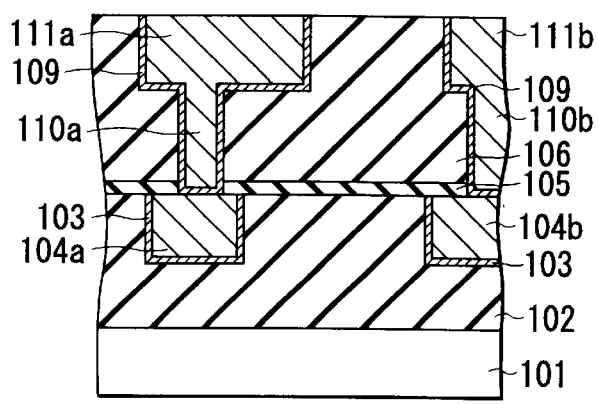

Next, as shown in FIG. 3, a material film (for example, a tantalum nitride film) for a barrier metal layer 109 and a material film (for example, copper) for interconnecting layers are sequentially deposited inside the via holes 107a and 107b and the interconnecting trenches 108a and 108b to thickness of 10 to 30 nm and 50 to 80 nm, respectively. Then, an electrolytic plating process is used to bury copper inside the via holes 107a and 107b and the interconnecting trenches 108a and 108b. The CMP process is used to remove an extra material film on the insulating film 106 in the second layer. As described above, a dual damascene interconnected structure composed of vias 110a and 110b and interconnecting layers 111a and 111b (second interconnecting layer) are formed at the position of the second layer.

Figure 4:
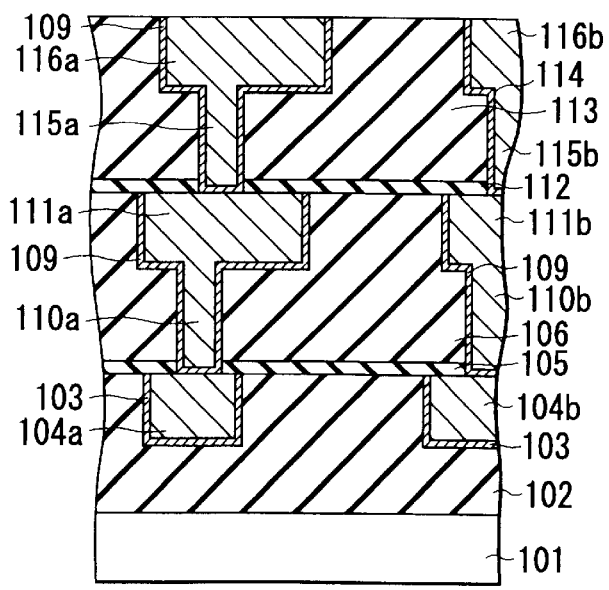

Next, as shown in FIG. 4, a dual damascene interconnected structure is formed at the position of a third layer (the uppermost layer). Specifically, first, a barrier layer 112 composed of,: for example, a silicon nitride film is formed on the insulating film 106 and interconnecting layers 111a and 111b in the second layer. Then, an insulating film 113 (first insulating film) constituting the third layer is formed on the barrier layer 112 using the plasma CVD process or the like. Subsequently, a barrier metal layer 114 composed of, for example, tantalum nitride, vias 115a and 115b composed of copper (first connecting layer), and interconnecting layers 116a and 116b composed of, for example, copper are formed in the insulating film 113 using a procedure and conditions similar to those for the dual damascene interconnected structure of the second layer. The vias 115a and 115b and the interconnecting layers 116a and 116b are connected to the interconnecting layers 111a and 111b in the second layer, respectively.

At this point, a pad electrode layer 117 is formed in a part of the interconnecting layer 116a or 116b (first interconnecting layer) in the uppermost layer. Further, a bump electrode or the like is formed on the pad electrode layer 117 so as to electrically connect to an external conductive member. The periphery of the bump electrode or the like is covered with a passivation film.

With reference to FIGS. 5 to 10, description will be given to a procedure of forming a passivation film and then a bump electrode. FIGS. 5 to 10 are sectional views taken along a line perpendicular to the longitudinal direction of the interconnecting layer 116a (pad electrode layer 117), showing the interconnecting layer 116a in the uppermost layer.

Figure 5:
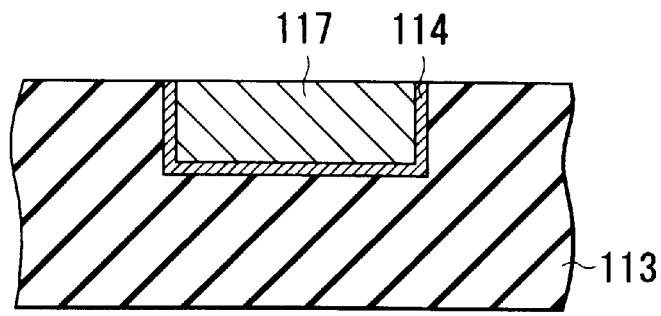

As shown in FIG. 5, the interconnecting layer 116a having the pad electrode layer 117 is formed in the interconnecting trenches in the insulating film 113 in the uppermost layer with the barrier metal layer interposed therebetween.

Figure 6:
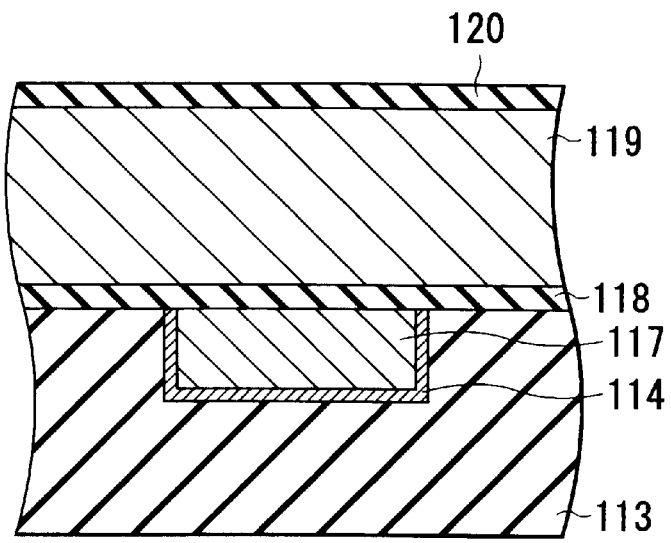

Then, as shown in FIG. 6, a barrier layer 118 (second insulating film) is formed on the insulating film 113 and the pad electrode layer 117 to a thickness of 10 nm to 100 nm, preferably 10 nm to 50 nm. The barrier layer 118 has a function of preventing the copper components of the interconnects from being diffused and may be composed of an insulating film such as silicon nitride, silicon carbide, and silicon carbonitride (SiCN).

Next, a passivation film 119 (first protective film) and a silicon oxide film 120 are sequentially formed on the barrier layer 118. The passivation film 119 is composed of metal material having a heat conductivity of 10 W/mK or more, preferably 100 W/mK or more, more preferably 200 W/mK or more, in order to improve a heat release characteristic of the semiconductor device. Further, the metal material preferably allows a thin and dense insulating passive covering film to be easily formed in a front layer portion of the film by a thermal oxidation process or a process using oxygen plasma. Specifically, aluminum, its alloy, or the like is used.

The passivation film 119 is formed on the barrier layer 118 to a thickness of 10 nm to 1 μm, preferably 10 nm to 100 nm, using a sputtering or the like. The passivation film 119 does not provide a passivation performance well enough as a protecting member and easiness of forming the passivation film 119 by the sputtering may not be obtained if the passivation film is too thin. On the other hand, too thick passivation film 119 is disadvantageous to improve the heat release characteristic of the semiconductor device. Then, a silicon oxide film 120 is formed on the passivation film 119 using the CVD process or the like.

Figure 7:
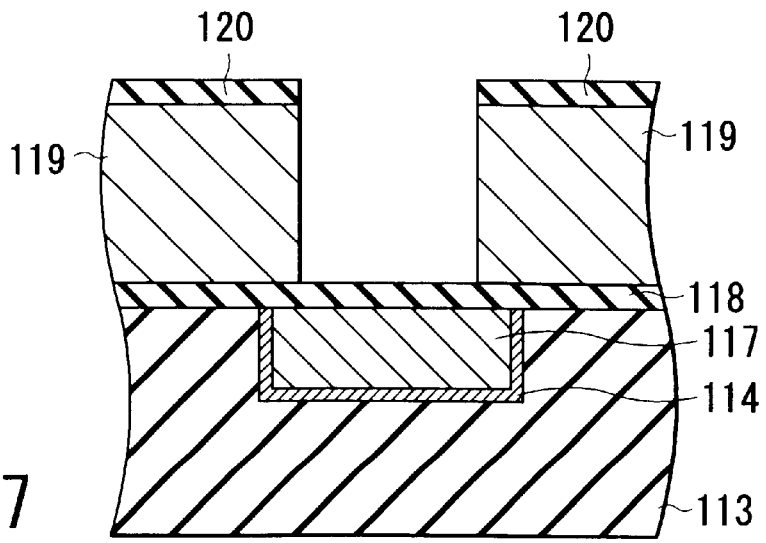

Next, as shown in FIG. 7, the silicon oxide film 120 and the passivation film 119 are sequentially etched. The etching operation is then stopped once the barrier layer 118 is reached. The silicon oxide film 120 and the passivation film 119 are processed under predetermined conditions using the dry etching technique such as the RIE process.

Figure 8:
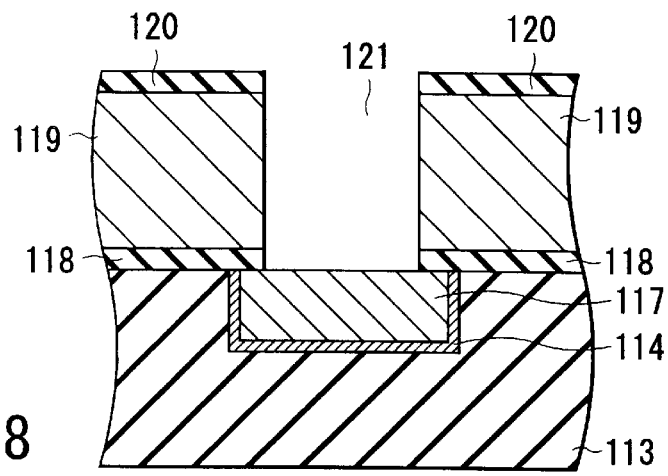

Next, as shown in FIG. 8, the dry etching technique such as the RIE process is used to remove the barrier layer 118 to form an opening 121 reaching the pad electrode layer 117. The opening 121 is formed by sequentially etching the silicon oxide film 120 and the passivation film 119 and then removing the barrier layer 118 is then removed as described. The barrier layer 118 acts as an etching stopper to prevent the pad electrode layer 117 from being overetched. This enables the opening to be formed without overetching the pad electrode layer 117 as previously described. Further, when the barrier layer 118 is etched, the barrier layer 118 can be removed while using the silicon oxide film 120 as a mask to protect the passivation film 119. A material for the film formed on the passivation film may be, instead of silicon oxide, insulating material having a larger etching selective etching ratio (a higher etching rate) than the material used for the barrier layer 118.

Figure 9:
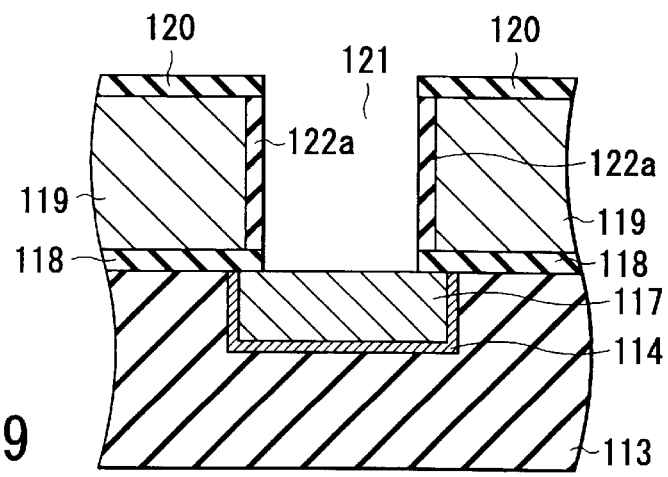

Next, as shown in FIG. 9, in the opening 121, a passive covering film 122a (third insulating film) is formed on the side wall surface of the passivation film 119. If aluminum or its alloy is used as the passivation film 119, then for example, aluminum oxide ($Al_2O_3$) is used as the covering film 122a. In this case, the covering film 122a may be formed to a thickness of about 1 nm to 10 nm by executing the thermal oxidation process, the process using oxygen plasma, or the like on the passivation film 119 at a temperature of about 200° C. or less. The covering film 122a may be an aluminum nitride film (AlN) formed to a thickness of about 1 nm to 10 nm.

Figure 10:
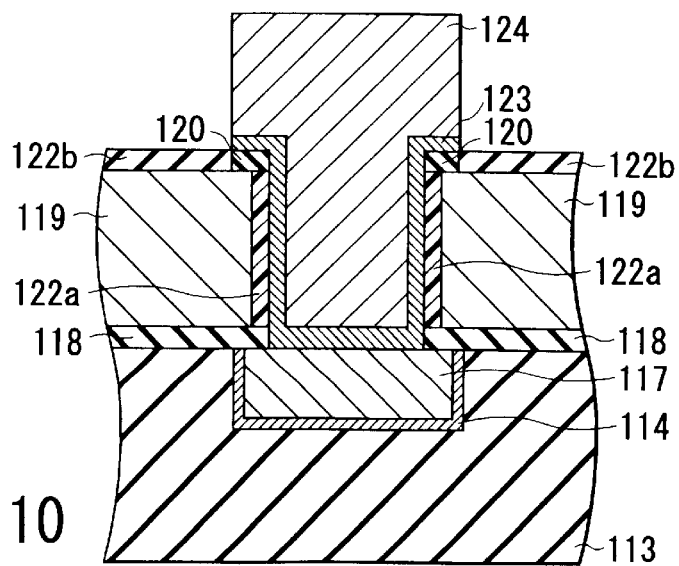

Next, as shown in FIG. 10, a material film (for example, a tantalum nitride film) for the barrier metal layer 123 is formed on the pad electrode layer 117 and the covering film 122a by the electrolytic plating process or the like. A solder material film is formed along this material film. Then, these material films are sequentially processed to patterns with predetermined dimensions and shapes using the dry etching technique. Subsequently, the silicon oxide film 120 on the passivation film 119 is removed by etching. Thus, a bump electrode (solder material) 124 composed of, for example, solder or gold is formed at a position on the pad electrode layer 117 with the barrier metal layer 123 interposed therebetween.

Besides tantalum oxide, the barrier metal layer 123 may be composed of any of tantalum, niobium, niobium oxide, titanium, and titanium nitride, or a film formed by stacking selected ones of these materials together.

Next, a covering film 122b (second protective film) is formed on a surface of the passivation film 119. If aluminum or its alloy is used as the passivation film 119, then for example, aluminum oxide is used as the covering film 122b. In this case, the covering film 122b with a film thickness of 1 nm to 10 nm, preferably 1 nm to 2 nm may be formed by executing the thermal oxidation process, the process using oxygen plasma, or the like at a temperature of about 200° C. or less. Further, since aluminum, its alloy, and the like tend to naturally form a thin and dense oxide film in their surface layer portion, the covering film 122b with a film thickness of 1 nm to 10 nm, preferably 1 nm to 2 nm can be formed by contacting a surface of the passivation film 118 with air. Note that passivating the surface of the passivation film 119 of about 1 nm or more can provide a dense covering film 122b without oxidizing the surface portion of the passivation film 119 more. On the other hand, too thick passivation film 119 may deteriorate the heat release characteristic. Therefore, the covering film 122b is formed to a thickness of 1 nm to 10 nm, preferably 1 nm to 2 nm.

Then, by way of example, the bump electrode 124 is electrically connected to a conductive portion (not shown) of known TAB tape material or the like with a barrier metal layer (not shown) or the like interposed therebetween so as to electrically connect to an external conductive material.

The passivation film 119 is formed to be electrically insulated (floating) from the surrounding conductors such as the pad electrode layer 117. If the passivation film 119 is not floating, the passivation film 119, the interconnecting layer (for example, the pad electrode layer 117) in the uppermost layer, and the insulating film 113 form a capacity. The capacity is likely to delay signal transmissions in the interconnecting layers. Accordingly, the passivation film 119 is desirably electrically floating.

The barrier layer 118 serves to electrically insulate the pad electrode layer 117 from the passivation film 119. The barrier metal layer 123 serves to prevent the reaction between the copper component of the pad electrode layer 117 and the components of the bump electrode 124.

Description will be given below of the effects of the present embodiment compared to a conventional example. In this case, the release of heat to the exterior of the device will be described with reference to the degree of an increase in the temperature of each interconnecting layer vs. an increase in current density.

A three-layer interconnected structure formed as previously described is used to simulate the present embodiment. Then, the degree of an increase in the temperature of each interconnecting layer is calculated. On the other hand, as a conventional example, a structure is used which has three layers of interconnects as in the case with the present embodiment and uses an insulating film (for example, a film formed by stacking a silicon nitride film and a silicon oxide film together) as a passivation film. Further, in FIG. 11, the results of the calculations are shown for each of the first to third interconnecting layers.

For the simulation, the percentages of an area taken up by the areas of the bump electrode, contact via, and passivation film in a unit area, and other values are used as parameters and set, for example, as follows: first, the percentage of the area taken up by the area of the bump electrode is 5% in both conventional example and present embodiment. Further, in each of the insulating films in the first to third layers, the percentage of the area taken up by the area (aperture cross section) of the via is 1% in both examples. The percentage of the area taken up by the area of the metal passivation film (for example, an aluminum film) is 95% in the present embodiment and 0% in the conventional example because the passivation film is composed of an insulating film.

Figure 11:
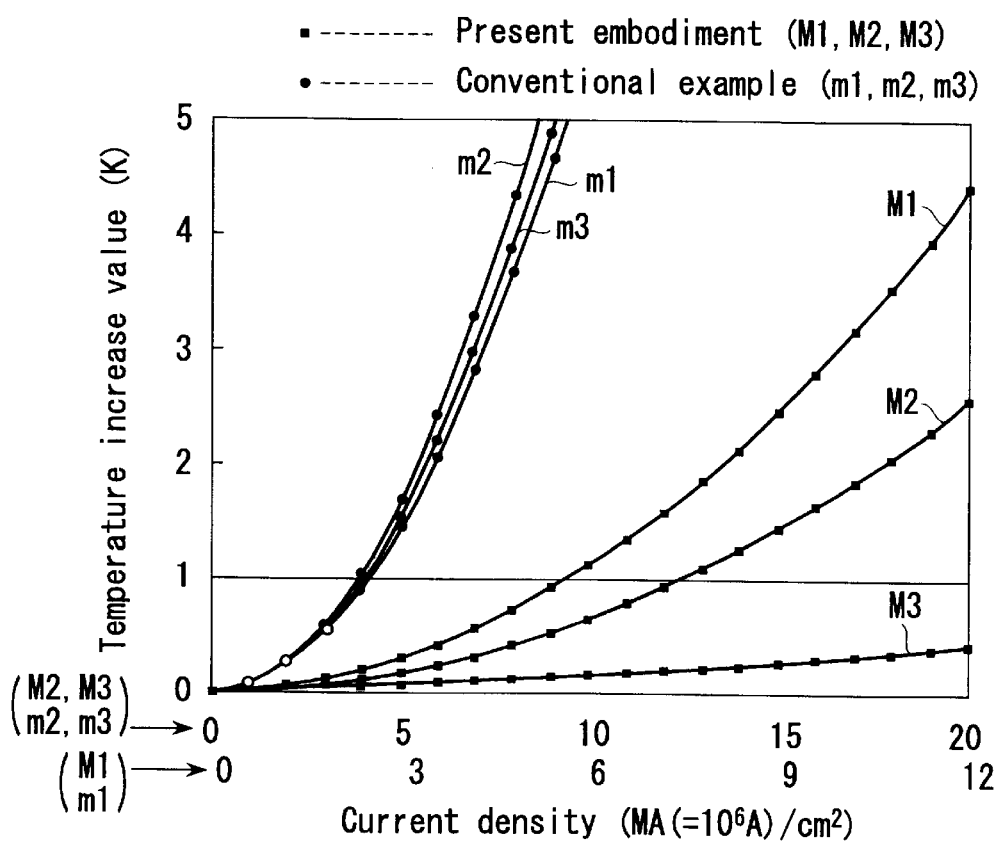
FIG. 11 is a diagram showing the effects of first embodiment of the present invention.

FIG. 11 shows the degree of an increase in the temperature of each interconnecting layer vs. an increase in current density. In this figure, for the results of calculations for the present embodiment, M1 (first layer=lowermost layer), M2 (second layer), and M3 (third layer=uppermost layer) are used to show the result for each layer. Further, for the results of calculations for the conventional example, m1 (first layer=lowermost layer), m2 (second layer), and m3 (third layer=uppermost layer) are used to show the result for each layer.

This figure indicates that in the conventional example, temperature increases rapidly in all of the first to third interconnecting layers in proportion to an increase in current density. On the other hand, the figure indicates that in the present embodiment, an increase in temperature is greatly suppressed in each of the first to third interconnecting layers compared to the conventional example.

Thus, according to the first embodiment of the present invention, a metal film having a high heat conductivity is used for the passivation film 119. Accordingly, a very large amount of heat is released to the exterior of the device to substantially suppress an increase in the temperature of each interconnecting layer itself compared to the conventional example. In particular, heat generated by the interconnecting layers is transmitted toward the front surface (upward) through the contacting vias. The heat is then effectively released from the passivation film 119 to the exterior of the device.

Further, according to the present. embodiment, the passivation film 119 is protected by the covering films 122a and 122b, formed on the front surface and in the front layer portion on the side wall surface. The passivation film 119 is electrically insulated from surroundings. The passivation film 119 prevents moisture from entering the interior of the device and also prevents corrosion and the like.

Further, according to the present embodiment, the covering films 122a and 122b are formed to be thin in the front layer portion of the passivation film 119. Consequently, heat can be effectively released to the exterior of the semiconductor device without greatly degrading the heat release characteristic of the passivation film 119.

In a step of mounting a LSI chip, the chip is often electrically bonded to an external conductive member such as outer lead material via a bump electrode or a metal wire. At this time, in the prior art, depending on material (metal, resin, or the like) used for the mounting step, a crack or the like may develop in the bump electrode or resin portion because of a difference in thermal expansion coefficient between this material and the passivation film (for example, a silicon nitride film or a silicon oxide film). However, if metal is used as the passivation film 119 as in the present embodiment, it acts as material that reduces stress because it is likely to. be elastically and plastically deformed. Therefore, the present embodiment enables the LSI chip mounting step to be effectively executed while preventing a crack or the like from developing in the bump electrode, the resin portion, and the like.

As a variation of the present embodiment, an insulating film such as a silicon nitride film may be formed on the surface of the passivation film 119. In this variation, by way of example, the interconnecting layer 116a with the pad electrode layer 117 is formed in the insulating film 113 of the uppermost layer (third layer) as in the previously described method. Subsequently, a silicon nitride film is formed using the procedures described below. This variation will be described below with reference to FIGS. 12 to 15.

Figure 12:
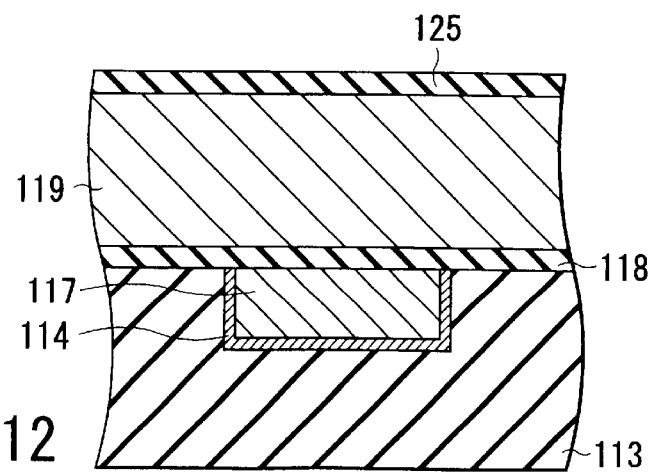
FIGS. 12, 13, 14, and 15 are sectional views showing a process of manufacturing a semiconductor device according to a variation of the first embodiment of the present invention.

First, as shown in FIG. 12, after the barrier layer 118 and the passivation film 119 are formed, a protective film 125 is formed on the barrier layer 118 and the passivation film 119. The protective film 125 is made of a silicon nitride or silicon oxide or a laminated film composed of these films. By way of example, the passivation film 119 is formed to a thickness of about 500 nm, using a sputtering method. Further, the protective film 125 is formed on the passivation film 119 to a thickness of about 5 nm to 100 nm, preferably 5 nm to 10 nm, using the CVD process or the like.

Figure 13:
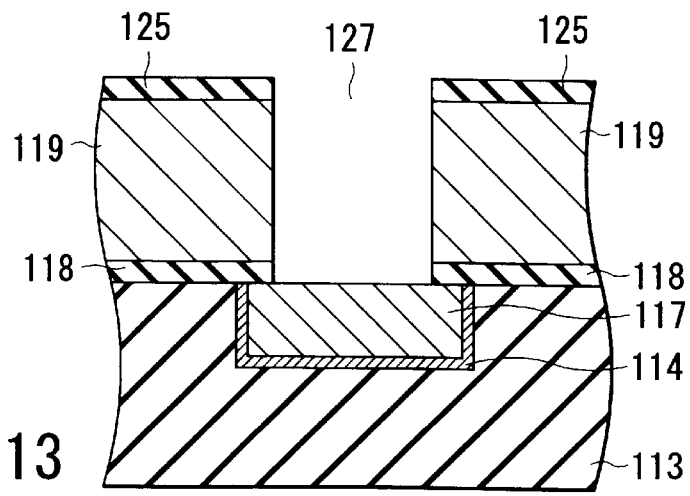

Next, as shown in FIG. 13, the dry etching technique or the like is used to sequentially process the protective film 125 and the passivation film 119 so as to remove their portions corresponding to the underlying pad electrode layer 117. Subsequently, the barrier layer 118 is removed to form an opening 127 reaching the pad electrode layer 117. When the barrier layer 118 is etched, the barrier 118 can be removed while protecting the passivation film 119 using the protective film 125 as a mask.

Figure 14:
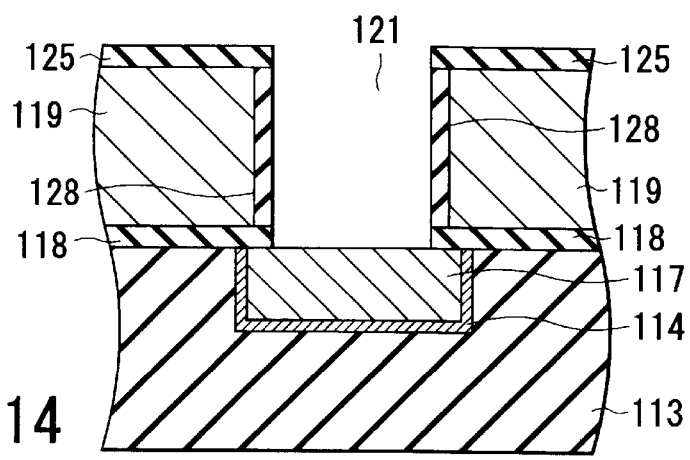

Next, as shown in FIG. 14, a covering film 128 is formed on the side wall surface of the passivation film 119 (the side wall surface of the opening 127) by executing a step similar to that shown in FIG. 9. The covering film 128 is constructed similarly to the film covering 122a.

Figure 15:
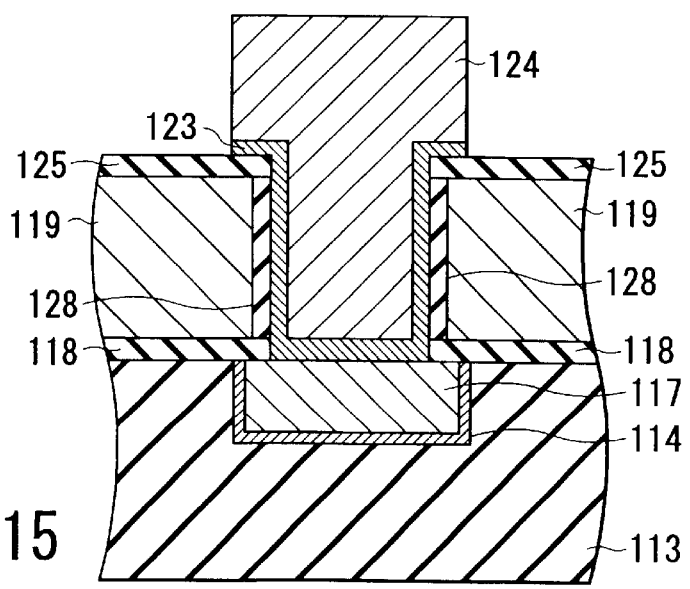

Then, as shown in FIG. 15, the barrier metal layer 123 and the bump electrode 124 are formed using a step similar to that shown in FIG. 10.

According to the semiconductor device based on the variation of the first embodiment, the protective film 125 and the covering film 128 protect the passivation film 119. This prevents moisture from entering the interior of the device and also prevents corrosion or the like of the device. Further, evens this variation improves the heat release characteristic compared to the conventional use of insulating material for the passivation film.

Second Embodiment

In a second embodiment, in addition to the structure of the semiconductor device shown in the first embodiment, a heating bump composed of metal material is formed on the passivation film 119 made of metal material to increase the amount of heat released to the exterior of the device.

With reference to FIGS. 16 to 19, description will be given of a method of manufacturing a semiconductor device according to the present embodiment.

Figure 16:
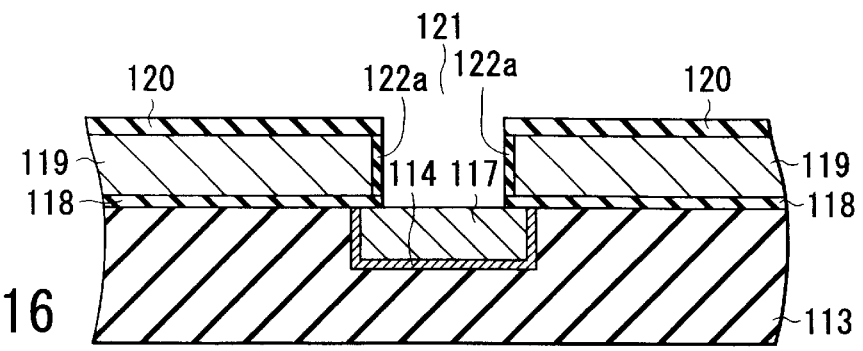
FIGS. 16, 17, 18, and 19 are sectional views showing a process of manufacturing a semiconductor device according to a second embodiment of the present invention.
Figure 17:
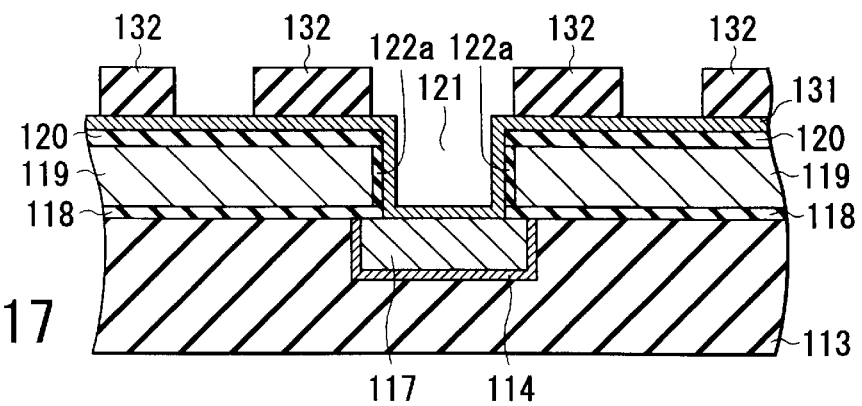

First, FIG. 16 shows a state in which steps similar to those shown in FIGS. 1 to 9 have already been executed. Then, as shown in FIG. 17, a barrier metal layer 131 composed of, for example, tantalum is formed on the silicon oxide film 120 and in the opening 121 as in the case with the first embodiment. Subsequently, the lithography technique is used to form a photo resist pattern 132 on the barrier metal layer 131 at a predetermined position.

Figure 18:
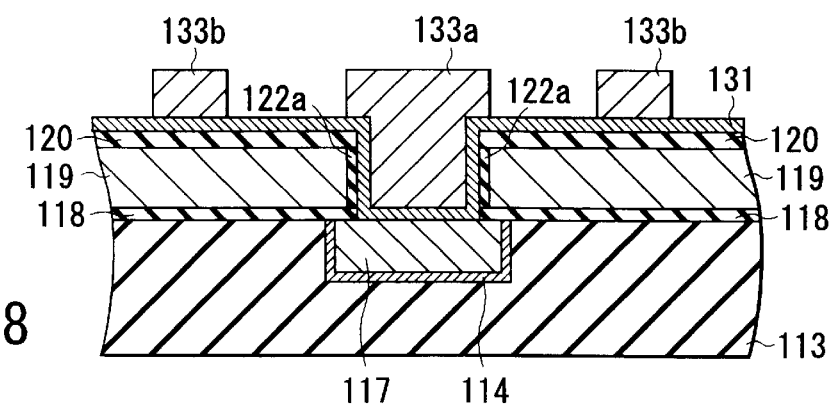

Then, as shown in FIG. 18, solder or gold material is buried in the gaps in the photo resist pattern 132 using the electrolytic plating process or the like. Then, the entire front surface is flattened. Subsequently, the photo resist pattern 132 is removed. As a result, a bump electrode 133a and a heat releasing bump 133b (first heat releasing member) both composed of the solder or metal material are simultaneously formed on the pad electrode 117 and the passivation film 119 at predetermined positions with the barrier metal layer 131 interposed therebetween.

The heat releasing bump 133b is formed to be convex, and its side wall surface thus increases the surface area of the heat releasing portion. Further, it is possible to form as many heat releasing bumps 133b as possible taking the number of them and the areas of the individual bumps into account. The heat release characteristic is improved depending on the number of heat releasing bumps.

Figure 19:
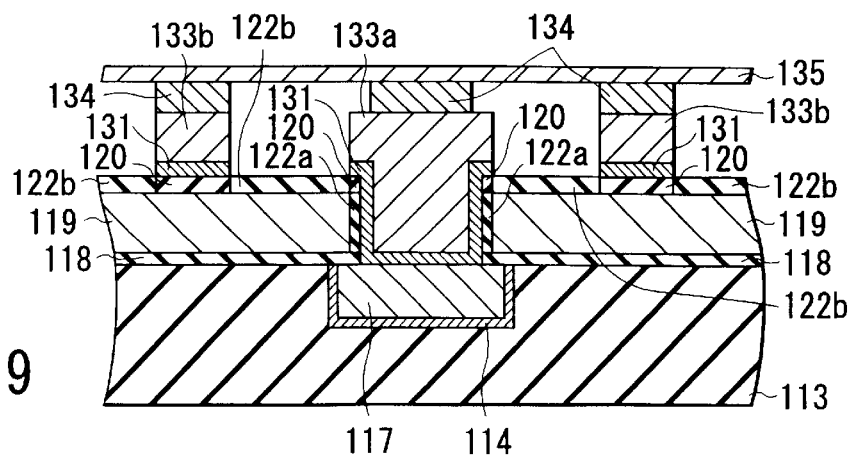

Next, as shown in FIG. 19, the surface of the passivation film 119 is exposed by using the dry etching technique such as the RIE process to partly remove the barrier metal layer 131 and the silicon oxide film 120 using each of the heat releasing bumps 133b as a mask. Subsequently, the covering film 122b is formed in the front layer portion of the passivation film 119 using a procedure and conditions similar to those in the first embodiment. Then, a conductive member of a TAB tape material 135 or the like is electrically connected to the bump electrode 133a and the heat releasing bump 133b with the barrier metal layer 134 interposed therebetween. When the barrier metal layer 134 is composed of metal material, this portion can be effectively structured to have a high heat conductivity. As a result, heat can be effectively released to the exterior of the device via the conductive member 135.

As in the case with the variation of the first embodiment, the protective film 125 can be formed on the passivation film 119 instead of the covering film 122b composed of aluminum oxide.

According to the semiconductor device based on the second embodiment of the present invention, in addition to the configurations of the first embodiment and its variation, the heat releasing bump 133b is formed on the passivation film 119. Therefore, the second embodiment produces effects similar to those of the first embodiment and its variation, and the heat releasing bump 133a serves to further improve the heat release characteristic. Furthermore, this embodiment can be easily adapted for a known mounting step including junction to the external conductive material 135, or the like. Further, this embodiment enables heat to be effectively released to the exterior of the device via the conductive member 135.

Further, in the semiconductor device according to the present embodiment, the heat releasing bump 133b is formed simultaneously with the formation of the bump electrode 133a. Furthermore, the heat releasing bump 133b is formed to be convex, and its side wall surface thus increases the area serving as a heat releasing member. Consequently, in the present embodiment, it is possible to easily increase the amount of heat released to the exterior of the device without adding any special complicated steps.

Third Embodiment

In the first and second embodiments, by way of example, the mounting steps have been described in which the bump electrode is formed on the inter-connecting layer and is then electrically joined to the external conductive member. In contrast, in the third embodiment, wires such as metal are used to connect the bump electrode portion, the pad electrode portion, and the like to the external conductive member.

The present embodiment will be described below with reference to FIGS. 20 to 24.

Figure 20:
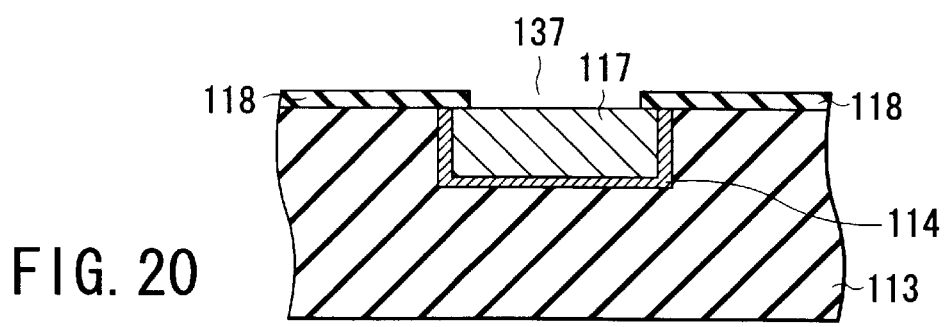
FIGS. 20, 21, 22, and 23 are sectional views showing a process of manufacturing a semiconductor device according to a third embodiment of the present invention.

First, as shown in FIG. 20, the barrier layer 118 is formed on the insulating film 113 and pad electrode layer 117 in the uppermost layer. Subsequently, the barrier layer 118 is partly removed using the lithography technique and the dry etching technique such as the RIE process to form an opening 137 reaching the pad electrode layer 117.

Figure 21:
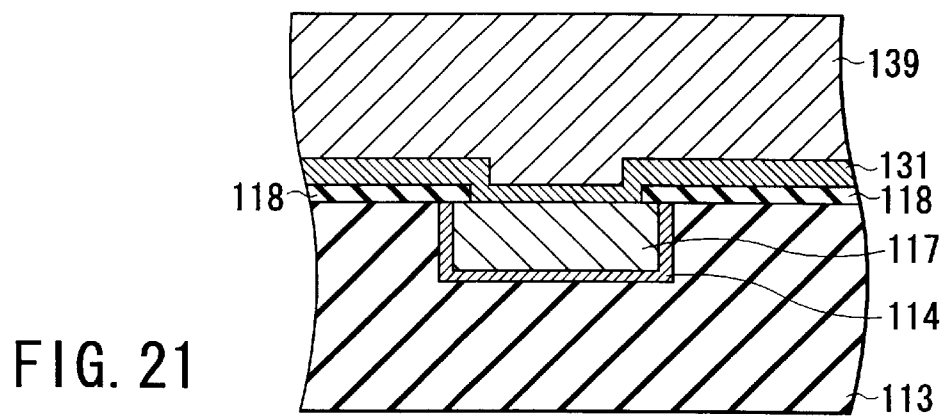

Then, as shown in FIG. 21, the sputtering process or the like is used to sequentially form the barrier metal layer 131 and the passivation film 139 on the barrier layer 118 and in the opening 137. The passivation film 139 is composed of material similar to that of the passivation film 119 and has a structure similar to that of this film.

Figure 22:
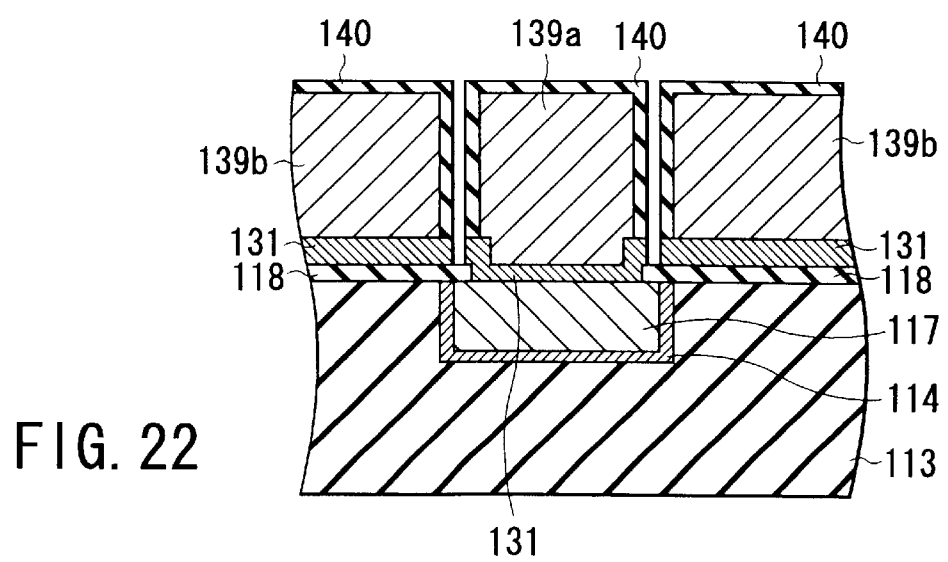

Then, as shown in FIG. 22, the lithography technique and the dry etching technique are used to separate the passivation film 139 into passivation films 139a and 139b that are electrically insulated from each other. The passivation film 139a (first portion) functions as a pad electrode portion used for bonding. The passivation film 139b (second portion) functions as a protective film. Then, a passive covering film 140 is formed on the passivation films 139a and 139b. The covering film 140 is composed of material similar to that of the films 122a and 122b and has a structure similar to that of these films. If aluminum is used as the passivation films 139a and 139b, the oxygen plasma process, thermal oxidation process, or the like is executed to form a covering film 140 on the front surfaces and side wall surfaces of the passivation films 139a and 139b. In this case, the covering film 140 is formed to a thickness of about 10 nm, preferably, in terms of stably insulating the passivation film 139a (first portion) serving as the pad electrode from the passivation film 139b (second portion) serving as the protective film.

The barrier metal layer 131 is also subjected to the dry etching technique so as to reach the barrier layer 118. As a result, the barrier metal layer 131 is separated into areas corresponding to the passivation films 139a and 139b, respectively. The passivation films 139a and 139b are electrically insulated from each other.

Figure 23:
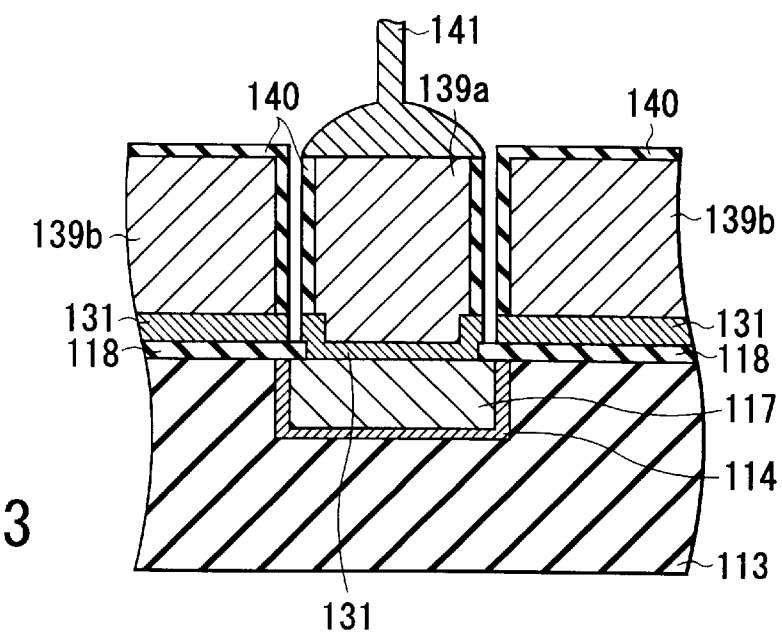

Then, as shown in FIG. 23, a wire 141 composed of, for example, gold or aluminum is used to connect the passivation film 139a to an external conductive member (not shown) composed of, for example, an outer lead material with the covering film 140 interposed therebetween. Subsequently, for protection, these components are subjected to resin sealing or the like so as to cover predetermined areas. A package is thus formed.

The resin sealing brings the passivation film 139b into contact with the resin with the covering film 140 interposed therebetween. Accordingly, an increase in the surface area of the passivation film 139a increases the area over which the passivation film contacts with the resin in the package. This improves the heat release characteristic.

Figure 24:
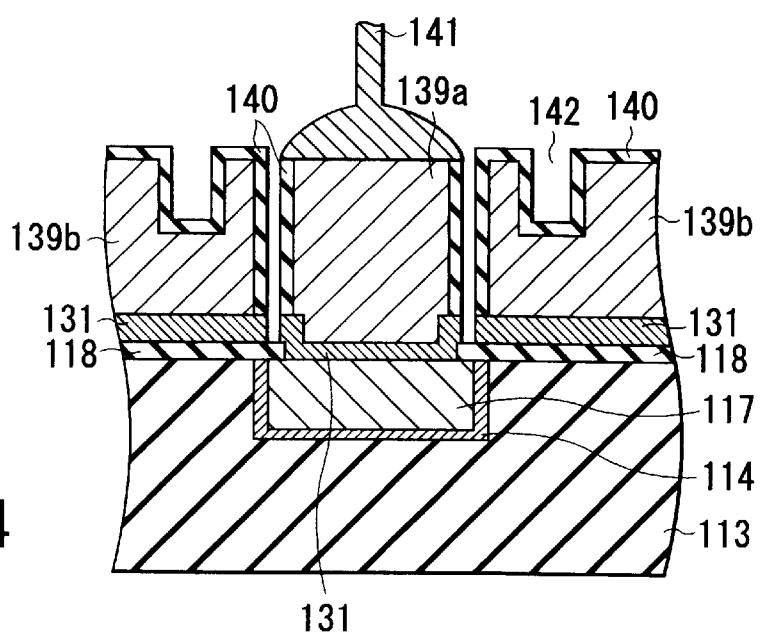
FIG. 24 is a sectional view showing a configuration of a semiconductor device according to a variation of the third embodiment of the present invention.

Further, for example, as shown in FIG. 24 as a variation of the present embodiment, concaves 142 may be formed in the passivation film 139b. As a result, the surface area of the passivation film 139a increases to further improve the heat release characteristic. In this case, before or after the passivation film 139 is separated into the films 139a and 139b by etching, the concaves 142 are formed by the lithography and dry etching techniques. According to this variation, the resin sealing serves to further increase the area over which the passivation film 139b and the resin contact with each other. Therefore, the heat release characteristic is improved.

According to the semiconductor device based on the third embodiment of the present invention, the present invention is applicable to the case in which the semiconductor device is electrically connected to the external conductive member by wire bonding. The third embodiment produces effects similar to those of the first and second embodiments and their variations.

Fourth Embodiment

A fourth embodiment is applied during the formation of the multilayer interconnected structure shown in the first embodiment. In the fourth embodiment, not only the passivation film is composed of metal but the insulating film between inter-connecting layers is provided with a heat releasing via (thermal via) composed of metal and, as required, a heat releasing interconnecting layer (thermal interconnect) composed of metal. When the heat releasing via is thus formed in a portion between the interconnecting layers in the insulating film, heat transmission from interior to exterior is facilitated. This improves the release of heat to the exterior of the device via the metal passivation film. Further, the heat releasing interconnecting layer allows heat from a wider area to be transmitted to the heat releasing via. This further improves the release of heat to the exterior of the device via the metal passivation film.

Thus, in the present embodiment, by way of example, predetermined numbers of heat releasing vias and thermal interconnects are formed between the electrically connected interconnecting layers so as to be connected together.

The present embodiment will be described with reference to FIGS. 25 to 29. FIGS. 25 to 29 are sectional views taken along a line perpendicular to the longitudinal direction of the interconnecting layers.

Figure 25:
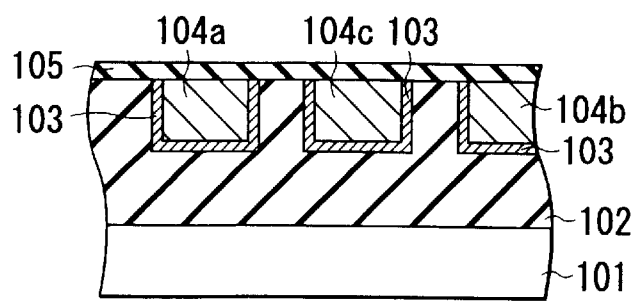
FIGS. 25, 26, 27, 28, and 29 are sectional views showing a process of manufacturing a semiconductor device according to a fourth embodiment of the present invention.

As shown in FIG. 25, steps similar to those in the first embodiment have been used to form the interconnecting layers 104a to 104c in the insulating film 102 with the barrier metal layer 103 interposed therebetween. Then, the barrier layer 105 is formed on the interconnecting layers 104a to 104c and the insulating film 102. The interconnecting layers 104a and 104b are electrically connected together (not shown). On the other hand, the heat releasing interconnecting layer 104c is electrically insulated from the surrounding components and is thus floating.

Figure 26:
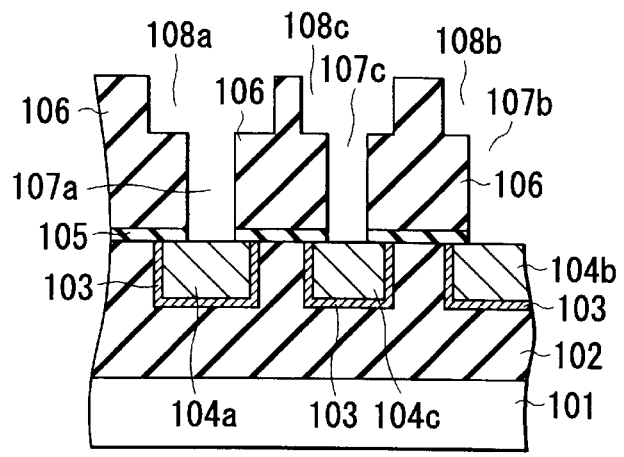

Next, as shown in FIG. 26, the insulator film 106 constituting the second layer is formed on the barrier layer 105. Subsequently, the lithography and dry etching techniques are used to sequentially form the via holes 107a, 107b, and 107c and the interconnecting trenches 108a, 108b, and 108c. The via hole 107c leads to the interconnecting layer 104c. The trench 108c leads to the via hole 107c.

Figure 27:
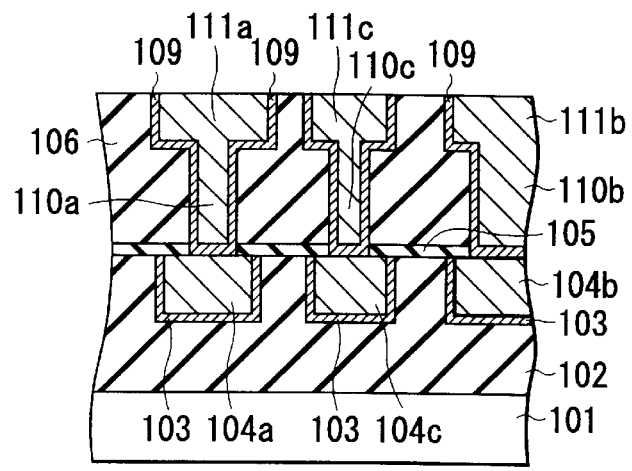

Then, as shown in FIG. 27, copper is buried in the via holes 107a to 107c and interconnecting trenches 108a to 108c with the barrier metal layer 109 interposed therebetween. As a result, a dual damascene interconnected structure is formed which is composed of the vias 110a and 110b and the interconnecting layers 111a and 111b. A heat releasing via 110c and a heat releasing interconnecting layer 111c are formed between the via 110a and interconnecting layer 111a and the via 110b and interconnecting layer 111b.

The interconnecting layers 111a and 111b are electrically connected together (not shown). The heat releasing interconnecting layer 111c is connected to the heat releasing interconnecting layer 104c in the first layer, is insulated from the surrounding components and is thus floating.

Figure 28:
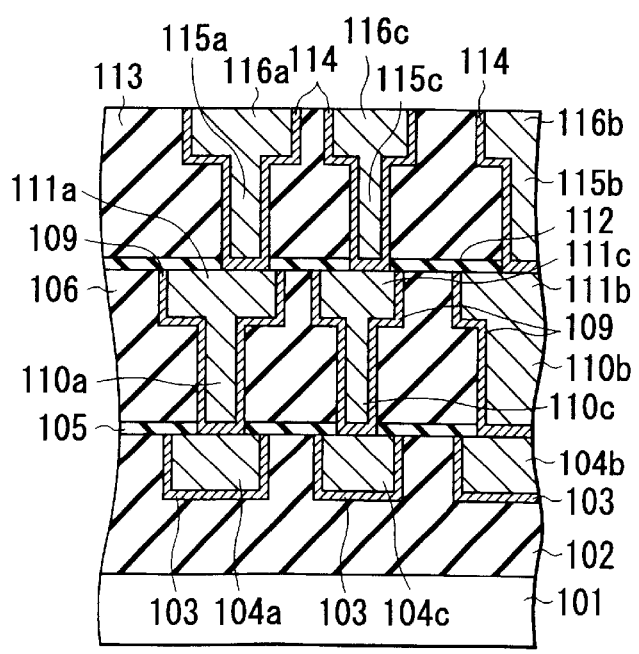

Then, as shown in FIG. 28, the barrier layer 112 and the insulating film 113 constituting the third layer are formed. Then, as in the case with the dual damascene structure of the third layer according to the first embodiment, a dual damaocene interconnected structure composed of the vias 115a and 115b and the interconnecting layers 116a and 116b is formed in the insulating film 113. Further, at the same time, a heat releasing via 115c and a heat releasing interconnecting layer (second heat releasing member) 116c are formed. As in the case with the second layer, the interconnecting layers 116a and 116b in the dual damascene interconnected structure of the third layer are electrically connected together. On the other hand, the heat releasing interconnecting layer 116c is connected to the heat releasing interconnecting layer 111c, but is insulated from the surrounding components.

Figure 29:
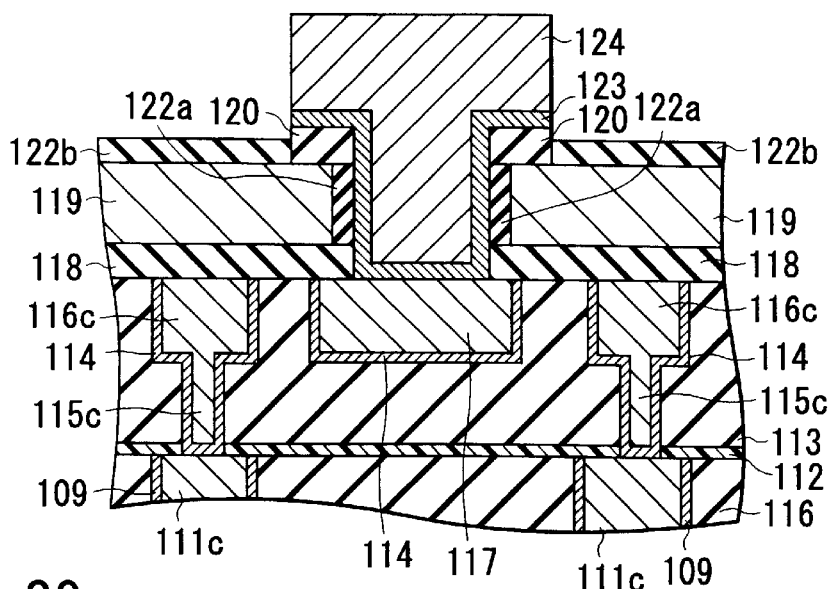

At this point, as in the case with the first embodiment, the pad electrode layer 117 is formed in a part of the interconnecting layer 116a in the uppermost layer. Then, as shown in FIG. 29, the passivation film 119 and the bump electrode 124 and the like are formed using a procedure and conditions similar to those in the first embodiment. FIG. 29 is a sectional view taken along a line perpendicular to the longitudinal direction of the interconnecting layer 116 (pad electrode layer 117) in the uppermost layer, showing an area around this interconnecting layer 116.

The heat releasing vias 110c and 115c and the heat releasing interconnecting layers 104c, 111c, and 116c can each be properly formed in the insulating film in a layer as required.

If the heat releasing vias 110c and 115c and the heat releasing interconnecting layers 104c, 111c, and 116c are not floating, then they may act on the surrounding insulating films, interconnecting layers, and the like to form a capacity. Thus, signal transmissions may be delayed. Accordingly, in the present embodiment, the heat releasing vias 110c and 115c and the heat releasing interconnecting layers 104c, 111c, and 116c are formed to be electrically insulated from the surrounding components in order to avoid delaying signal transmissions.

With reference to FIGS. 30 to 35, the effects of the present embodiment will be described below on the basis of a comparison with a conventional example. In this case, simulated computations are executed on the present embodiment and conventional example. Further, the a outward heat release characteristic will be described with reference to the degree of an increase in the temperature of each interconnecting layer vs. an increase in current density.

As an example of simulation for the present embodiment, a three-layer interconnected structure formed as previously described is employed in which the aperture cross section of the heat releasing via is fixed in each insulating film. On the other hand, as a conventional example, a structure is employed which has three layers of interconnecting layers and includes a passivation film composed of an insulating film (for example, a silicon nitride film or a silicon oxide film) as in the case with the present embodiment. Thus, on the basis of a comparison with the conventional example, it is possible to see the outward heat release characteristic obtained if a heat releasing metal member is provided in the insulating film in addition to a metal passivation film provided as in the present embodiment.

For the simulation, the percentages of an area taken up by the areas of the bump electrode, metal passivation film, contact via, and heat releasing via, and other values are used as parameters and set, for example, as follows: first, the percentages of the area taken up by the total area (aperture cross section) of the bump electrode (for example, solder material) and contact via and by the area of the metal passivation film (for example, an aluminum film) are similar to those in the first embodiment (FIG. 5). Then, in the present embodiment, the simulation is performed to given total area (aperture cross section) of the heat releasing via in the insulating films in the first to third layers. The simulation shows a contribution of this area to the heat release characteristic.

In this simulation, the following insulating film may be formed between the interconnecting layers: an insulating film formed by plasma CVD, an insulating film (such as an organic silicon oxide film, for example) having a lower heat conductivity and a smaller dielectric constant than the plasma-CVD-based insulating film, or the like. These insulating films are each used as an interlayer insulating film between interconnecting layers made of copper or the like and having little resistance. Accordingly, the outward heat release characteristic can be determined taking expressly into account the case in which copper is used as interconnect material.

First, with reference to FIGS. 30 to 32, description will be given of the case in which a plasma CVD (for example, a plasma silicon oxide film) is used to form the insulating film between the interconnecting layers.

Figure 30:
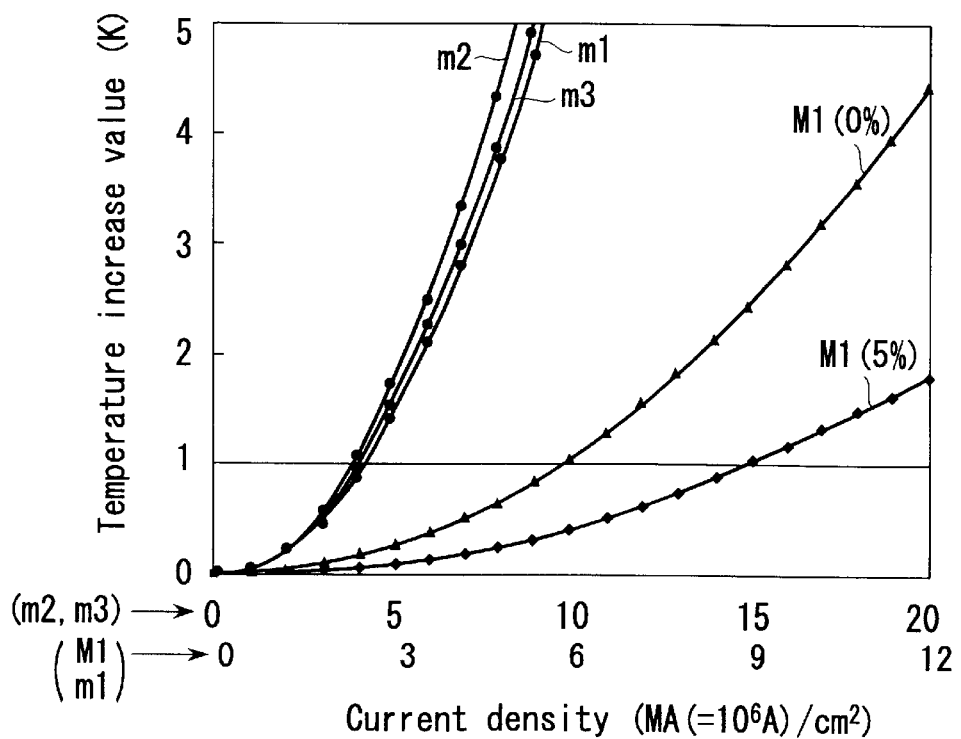
FIGS. 30, 31, 32, 33, 34, and 35 are diagrams showing the effects of fourth embodiment of the present invention.
Figure 31:
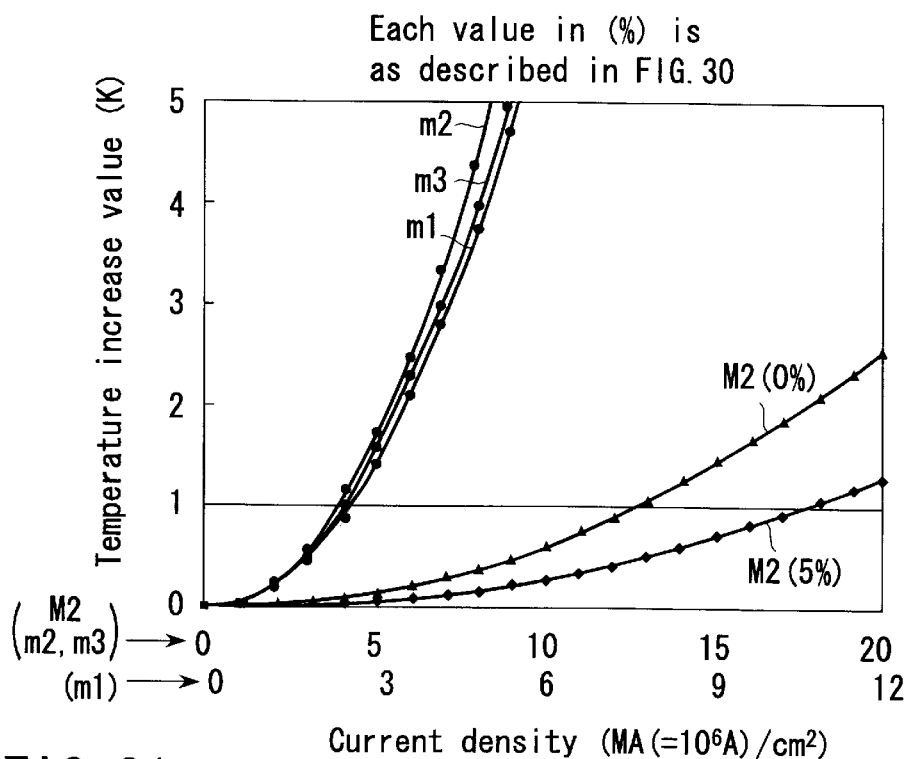
Figure 32:
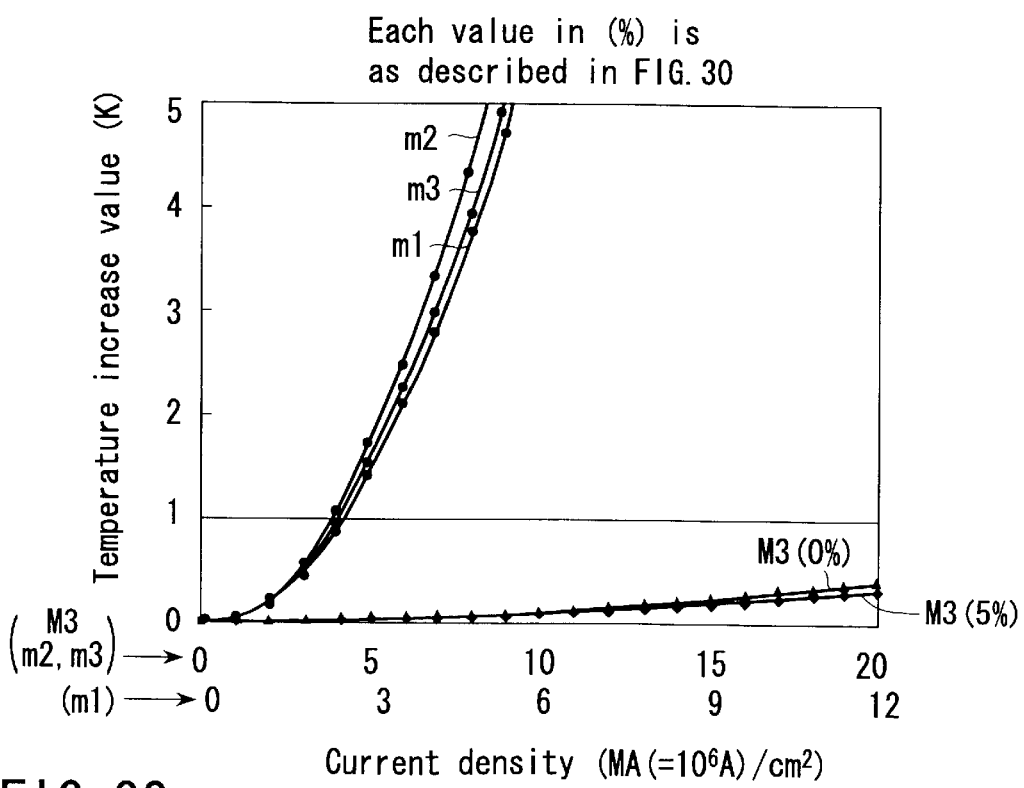

FIGS. 30 to 32 show the degree of an increase in the temperature of each interconnecting layer vs. an increase in current density for the present embodiment and the conventional example in the case where a plasma silicon oxide film is used as the insulating film between the interconnecting layers. In each of the insulating films in the first to third layers, by way of example, the percentage of an area taken up by the aperture cross section of the heat releasing via in a unit area is set to be about 5%.

FIGS. 30 to 32 show the degree of an increase in the temperature of each interconnecting layer vs. an increase in current density in M1 (first layer=lowermost layer), M2 (second layer), and M3 (third layer=uppermost layer). In these figures, M1 (5%), M2 (5%), and M3 (5%) denote the results of simulation in which a heat releasing via is formed in each layer so that the percentage of the area taken up by their area in a unit area is about 5%. Further, for reference, M1 (0%), M2 (0%), and M3 (0%) denote the results of simulation in which the device is provided with a metal passivation film but no heat releasing vias. Further, in the figures, the results of calculations for each layer in the conventional example are shown using m1 (first layer= lowermost layer), m2 (second layer), and m3 (third layer= uppermost layer).

The results of the simulation indicate that the conventional example exhibits a similar change in all of the first to third interconnecting layers (m1 to m3) and that an increase in current density sharply increases the temperatures of the interconnecting layers, as shown in FIGS. 30 to 32. In contrast, for the present embodiment, M1 (5%) in FIG. 30 indicates that in the first interconnecting layer (M1), an increase in current density significantly suppresses an increase in its temperature, compared to the conventional example. Further, in particular, the suppression of an increase in the temperature of the interconnecting layer is also marked compared to the case in which no heat releasing vias are formed (M1 (0%)). This indicates that forming the heat releasing via as well as the metal passivation film improves the heat release characteristic, thus suppressing an increase in the temperature of the interconnecting layer. Further, it is appreciated that similar effects are produced for M2 (5%) and M3 (5%) in FIGS. 31 and 32.

These results indicate that if the passivation film is made of metal and a heat releasing via is formed in each insulating film, then the outward heat release characteristic is improved compared to the conventional example. Thus, an increase in temperature is suppressed in all of the first (M1) to third (M3) layers. Consequently, it is appreciated that in the present embodiment, if an insulating film formed by plasma CVD is used in one of the first to third layers (the insulating film 102, 106, or 113), an increase in temperature can be suppressed in the interconnecting layers compared to the conventional example. Further, using material such as copper which has little resistance for interconnecting layers,; a semiconductor device can be constructed which operates at high speed and has an excellent heat release characteristic.

Next, with reference to FIGS. 33 to 35, description will be given of the case in which insulating films of a small dielectric constant (for examples, organic silicon oxide films) are used in the interconnecting layers.

Figure 33:
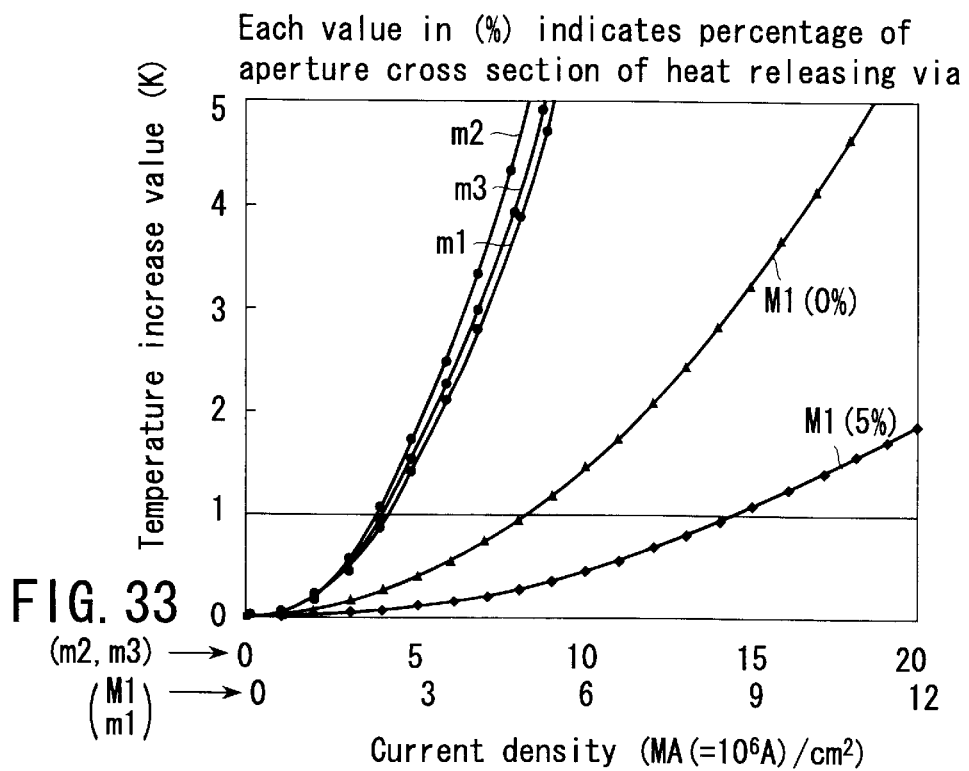
Figure 34:
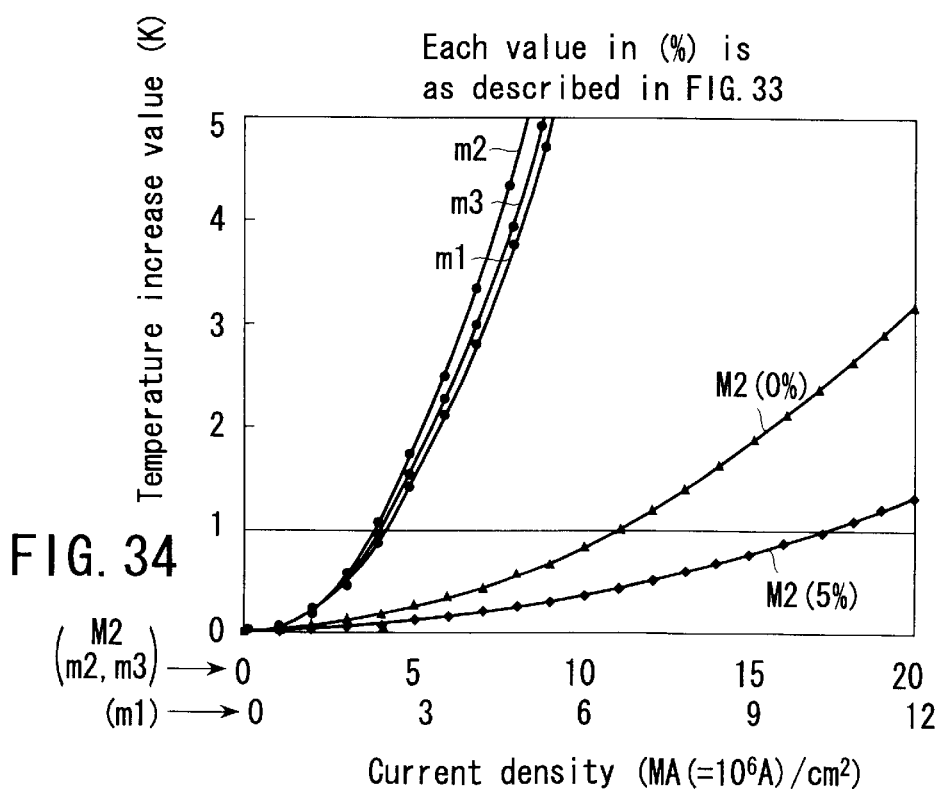
Figure 35:
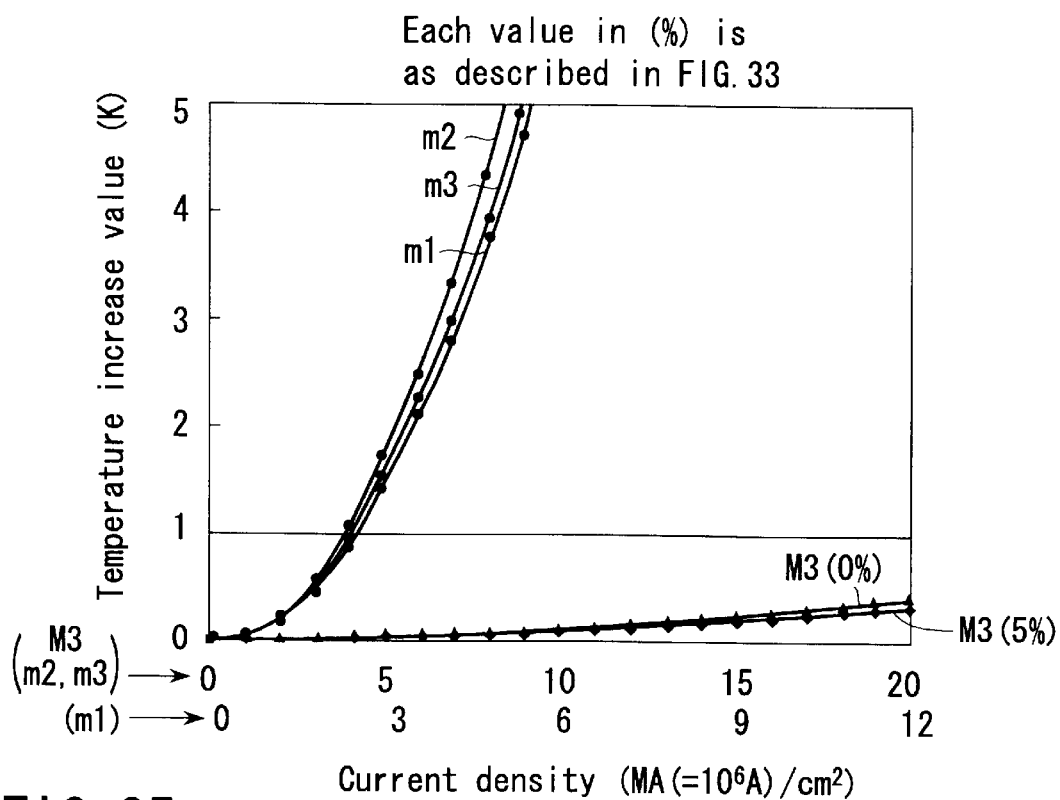

FIGS. 33 to 35 show the degree of an increase in the temperature of each interconnecting layer vs. an increase in current density for the present embodiment and the conventional example in the case where an organic silicon oxide film is used as the insulating film between the interconnecting layers. In each of the insulating films in the first to third layers, by way of example, the percentage of the area taken up by the aperture cross section of the heat releasing via in a unit area is set to be about 5%.

FIGS. 33 to 35 show the degree of an increase in the temperature of each interconnecting layer vs. an increase in current density in M1 (first layer=lowermost layer), M2 (second layer), and M3 (third layer=uppermost layer). In these figures, M1 (5%), M2 (5%), and M3 (5%) denote the results of simulation in which heat releasing vias are formed in each layer so that the percentage of the area taken up by their area in a unit area is about 5%. Further, for reference, M1 (0%), M2 (0%), and M3 (0%) denote the results of simulation in which the device is provided with a metal passivation film but no heat releasing vias. Further, in the figures, the results of calculations for each layer in the conventional example are shown using m1 (first layer= lowermost layer), m2 (second layer), and m3 (third layer= uppermost layer).

The results of the simulation indicate that the conventional example exhibits a similar change in all of the first to third interconnecting layers (m1 to m3) and that an increase in current density sharply increases the temperatures of the interconnecting layers, as shown in FIGS. 33 to 35. In contrast, for the present embodiment, M1 (5%) in FIG. 30 indicates that in the first interconnecting layer (M1), an increase in current density significantly suppresses an increase in its temperature, compared to the conventional example. Further, in particular, the suppression of an increase in the temperature of the interconnecting layer is also marked compared to the case in which no heat releasing vias are formed (M1 (0%)). This indicates that forming heat releasing vias as well as a metal passivation film improves the heat release characteristic, thus suppressing an increase in the temperature of the interconnecting layer. Further, it is appreciated that similar effects are produced for M2 (5%) and M3 (5%) in FIGS. 34 and 35.

These results indicate that if the passivation film is made of metal and a heat releasing via is formed in each insulating film, then the external heat release characteristic is improved compared to the conventional example. Thus, an increase in temperature is suppressed in all of the first (M1) to third (M3) layers.

Further, similar results are produced for each layer compared to insulating films formed by plasma CVD (see FIGS. 30 to 32). Insulating films with a small dielectric constant (for examples, organic silicon oxide films) have a lower heat conductivity than insulating films formed by plasma CVD. Accordingly, if an insulting film with a small dielectric constant is used in any one of the first to third layers (the insulating film 102, 106, or 113), an increase in the temperature of each interconnecting layer can be suppressed, thus improving the heat release characteristic, compared to the conventional example. Further, even if the interconnecting layers are made of material such as copper which has little resistance and an insulating film with a small dielectric constant is provided between the interconnecting layers, then a semiconductor device can be constructed which operates at high speed and has an excellent heat release characteristic.

The present embodiment is also effective in the case in which a so-called aerial interconnected structure is used in order to reduce. the capacity between the interconnecting layers. That is, in an aerial interconnected structure, the: areas corresponding to the interlayer insulating films are in a vacuum or are filled with a gas. The area which is in a vacuum or is filled with a gas have a very low heat conductivity and a sharply reduced amount of heat released. Thus, the application of the present embodiment effectively improves the heat release characteristic and markedly contributes to the aerial interconnected structure. Sectional views of this device are similar to FIGS. 25 to 29.

As described above, the formation of heat releasing vias in the insulating films improves the release of heat to the exterior of the device. The passivation film is made of metal and that in the insulating film in each layer, the percentage of the area taken up by the area of the heat releasing via in a unit area may be, for example, 1% or more.

If the passivation film is composed of an insulating film such as a silicon oxide film or a silicon nitride film as in the conventional example, heat transmission is blocked in this portion. Accordingly, heat is hindered from being released to the exterior of the device. Consequently, in a multilayer interconnected structure, there are few differences in temperature among interconnecting layers. The heat release characteristic cannot be improved even by forming heat releasing vias in insulating films. In contrast, when the passivation film is composed of metal as in the first embodiment, the amount of heat released increases starting with this portion. This results in differences in temperature among the interconnecting layers. Further, in this case, the higher the interconnecting layer is located, the smaller the increase in its temperature. Under these circumstances, if the heat releasing vias 110c and 115c are formed in the corresponding insulating films as in the present embodiment, heat is effectively transmitted to the metal passivation film 119. Therefore, an increase in temperature is suppressed to improve the release characteristic of the entire semiconductor device.

According to the semiconductor device based on the fourth embodiment of the present invention, the passivation film 119 has a structure similar to that of the first embodiment. Thus, the fourth embodiment produces effects similar to those of the first embodiment.

Furthermore, according to the fourth embodiment, the heat releasing vias 110c and 115c and the heat releasing interconnecting layers 104c, 111c, and 116c are formed in the corresponding insulating films. Thus, heat is released to the exterior of the device through the heat releasing vias 110c and 115c and the heat releasing interconnecting layers 104c, 111c, and 116c. This improves the heat release characteristic of the semiconductor device.

Moreover, the heat releasing vias 110c and 115c and the heat releasing interconnecting layers 104c, 111c, and 116c are all connected together. The heat releasing interconnecting layer 116c, constituting the uppermost layer, is formed immediately below the passivation film 119 via the barrier layer 118. As a result, heat from a wide area is transmitted to the heat releasing vias 110c and 115c. Further, heat can be more effectively released to the exterior of the device via the metal passivation film 119. In this regard, similar effects are produced by connecting the heat releasing interconnecting layers vias 110c and 115c directly together.

Further, in the present embodiment, the heat releasing vias 110c and 115c and others are formed simultaneously with the formation of the vias 110a, 110b, 115a, and 115b. Further, the patterns such as the heat releasing interconnecting layers 104c, 111c, and 116c are formed simultaneously with the formation of the interconnecting layers 104a, 104b, 111a, 111b, 116a, and 116b. Therefore, in the present embodiment, the heat releasing vias and the heat releasing interconnecting layers can be formed without adding any special complicated steps.

Next, a variation of the present embodiment will be described with reference to FIG. 36. In this variation, in the previously described semiconductor device structure (see FIG. 29), the metal passivation film and the heat releasing interconnecting layer are connected together via a barrier metal layer or the like in order to improve the heat release characteristic.

Figure 36:
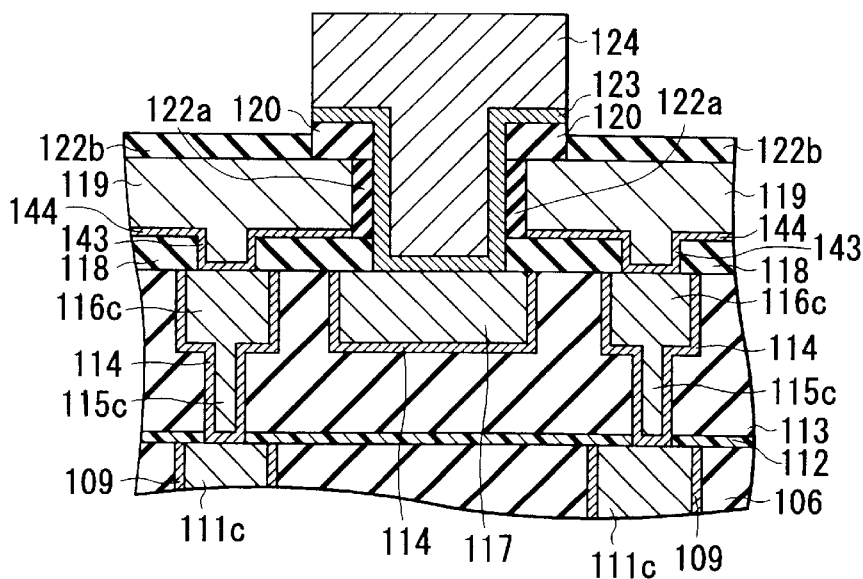
FIG. 36 is a sectional view showing the structure of a semiconductor device according to a variation of the fourth embodiment of the present invention.

This structure is shown in FIG. 36, and specific description will be given of a procedure of connecting the metal passivation film and the heat releasing layer together via the barrier metal layer. FIG. 36 is a sectional view taken along a line perpendicular to the longitudinal direction of the interconnecting layer formed over the semiconductor substrate 101 and located in the uppermost layer, showing an area around this interconnecting layer.

First, with the pad electrode layer 117 formed in the uppermost interconnecting layer 116a (or 116b), the barrier layer 118 is formed all over the surface of the interconnecting layer 116a. Subsequently, connection holes 143 reaching the heat releasing interconnecting layer 116c are formed in the barrier layer 118. Then, a barrier metal layer 144 composed of, for example, tantalum nitride is formed on the barrier layer 118 to a thickness of about 50 nm or less so as to include the connection holes 143.

Then, the passivation film 119 and the silicon oxide film 120 are formed. The passivation film 119 is connected, at the positions of the connection holes 143, to the uppermost (third layer) heat releasing interconnecting layer 116c via the barrier metal layer 144. Then, steps similar to those of the first embodiment are executed to form the covering films 122a and 122b, the barrier metal layer 123, and the bump electrode 124.

According to the semiconductor device based on the variation of the fourth embodiment of the present invention, each piece of the uppermost heat releasing interconnecting layer 116c is connected to the passivation film 119 in the corresponding connection hole 143 via the barrier metal layer 144. Consequently, it is possible to effectively transmit heat from the interconnecting layer 116c to the passivation film 119. This improves the heat release characteristic. In this case, it is possible to improve the transmission of heat from each piece of the heat releasing interconnecting layer 116c to the passivation film 119 by increasing the size of the openings of the connection holes 143 or by other means.

Further, in general, the direct contact between a copper and aluminum components results in the formation of a reactant. Accordingly, if the heat releasing interconnecting layer 116c is made of copper, the passivation film 119 is made of aluminum or its alloy, and they are connected directly together, then the copper and aluminum may react to each other. The formation of the reactant reduces the efficiency with which heat is transmitted. However, in this variation, the barrier metal layer 144 is formed between the heat releasing interconnecting layer 116c and the passivation film 119. This prevents the formation of the reactant based on the reaction between copper and aluminum.

In this variation, the barrier metal layer 144 may be a high-melting-point metal film or a high-melting-point metal nitride film. Specifically, the high-melting-point metal film may be tantalum (Ta), niobium (Nb), tungsten (W), titanium (Ti), or the like. The high-melting-point metal nitride film may be tantalum nitride (TaNx), or niobium nitride (NbNx), tungsten nitride (WNx), titanium nitride (TiNx), or the like. Alternatively, a stacked film can be formed by selecting any of these high-melting-point metal films and high-melting-point metal nitride films.

In the present embodiment and its variation, the protective film 125 may be formed on the surface of the passivation film 119 in place of the covering film 122b composed of aluminum oxide as in the case of the variation of the first embodiment.

Further, in the present embodiment and its variation, the heat releasing bump 133b may be formed on the passivation film 119 (see FIGS. 16 to 19) to increase the surface area of the heat releasing portion as in the second embodiment. This further improves the heat release characteristic of the semiconductor device.

Furthermore, the present embodiment and its variation are applicable to the case in which the device is electrically connected to an external conductive member by wire bonding as in the third embodiment (see FIGS. 20 to 24). This further improves the heat release characteristic of the semiconductor device.

Moreover, in the first to fourth embodiments, in addition to copper, aluminum, silver, gold, tungsten, and alloy composed of these materials, or the like may be used as interconnect material. Alternatively, different interconnect materials may be used for the respective layers.

Furthermore, the damascene interconnected structure or the dual damascene interconnected structure can be applied to some layers rather than to all interconnects. If aluminum, its alloy, or the like is used for the interconnecting layers, the layers can be also directly patterned using the dry etching technique such as the RIE process without using the damascene interconnected structure or the dual damascene interconnected structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first insulating film provided above the semiconductor substrate;
   a first interconnecting layer provided on the first insulating film;
   a second insulating film provided above the first interconnecting layer and the first insulating layer;
   a first protective film provided above the second insulating film, composed substantially of metal material; and
   a second protective film composed substantially of a passivity of the metal material, provided on a surface of the first protective film.

2. The device according to claim 1, wherein the first protective film is composed substantially of material selected from a group consisting of aluminum and aluminum alloy.

3. The device according to claim 1, wherein the first protective film is composed substantially of material having a heat conductivity of 10 W/mK or more.

4. The device according to claim 1, wherein the first protective film is electrically floating.

5. The device according to claim 1, wherein the first protective film has a concave portion formed on its surface.

6. The device according to claim 1, wherein the first protective film and the second protective film have a total thickness of 10 nm to 1 $\mu$m.

7. The device according to claim 1, wherein the second protective film is composed substantially of aluminum oxide.

8. The device according to claim 1, wherein the second protective film has a thickness of 1 nm to 10 nm.

9. The device according to claim 1, further comprising:
   a third insulating film provided on a side wall of the first protective film at a portion where an opening extending from the surface of the second protective film to the first interconnecting layer is formed; and
   an electrode section buried in the opening so as to be electrically connected to the first interconnecting layer.

10. The device according to claim 1, further comprising a first heat releasing member provided above the first protective film and composed substantially of metal material.

11. The device according to claim 9, further comprising a first heat releasing member provided above the first protective film and composed substantially of the same material as that of the electrode section.

12. The device according to claim 1, wherein the first protective film comprises:
   a first portion electrically connected to the first interconnecting layer and functioning as an electrode section; and a second portion insulated from the first portion, the second protective film being provided on a surface of the second portion.

13. The device according to claim 1, further comprising a second heat releasing member provided on the first insulating film, electrically floating, and composed substantially of metal material, the first protective film being provided above the second heat releasing member.

14. The device according to claim 13, wherein the second heat releasing member has substantially the same structure as that of the first interconnecting layer.

15. A semiconductor device comprising:
   a semiconductor substrate;
   a first insulating film provided above the semiconductor substrate;
   a first interconnecting layer provided on the first insulating film;
   a second insulating film provided above the first interconnecting layer and the first insulating layer;
   a passivation film provided above the second insulating film, composed substantially of metal material, and having a function of protecting the first insulating film and the first interconnecting layer and a function of releasing heat from the first interconnecting layer; and
   a passive covering film of the metal material provided on a surface of the passivation film, and having a function of protecting the first insulating film and the first interconnecting layer.

16. The device according to claim 15, wherein the passivation film is composed substantially of material selected from a group consisting of aluminum and aluminum alloy.

17. The device according to claim 15, wherein the passivation film is composed substantially of material having a heat conductivity of 10 W/mK or more.

18. The device according to claim 15, wherein the passivation film and the passive covering film have a total thickness of 10 nm to 1 $\mu$m.

19. The device according to claim 15, wherein the passive covering film is composed substantially of aluminum oxide.

20. The device according to claim 15, wherein the passive covering film has a thickness of 1 nm to 10 nm.

* * * * *